US011942130B2

(12) United States Patent
Chen et al.

(10) Patent No.: US 11,942,130 B2
(45) Date of Patent: Mar. 26, 2024

(54) BOTTOM-PINNED SPIN-ORBIT TORQUE MAGNETIC RANDOM ACCESS MEMORY AND METHOD OF MANUFACTURING THE SAME

(71) Applicant: UNITED MICROELECTRONICS CORP., Hsin-Chu (TW)

(72) Inventors: Jian-Jhong Chen, Tainan (TW); Yi-Ting Wu, Tainan (TW); Jen-Yu Wang, Tainan (TW); Cheng-Tung Huang, Kaohsiung (TW); Po-Chun Yang, Tainan (TW); Yung-Ching Hsieh, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 111 days.

(21) Appl. No.: 17/701,703

(22) Filed: Mar. 23, 2022

(65) Prior Publication Data

US 2023/0282260 A1   Sep. 7, 2023

(30) Foreign Application Priority Data

Mar. 2, 2022 (CN) .......................... 202210197858.6

(51) Int. Cl.
| | |
|---|---|
| *G11C 11/00* | (2006.01) |
| *G11C 11/16* | (2006.01) |
| *H10B 61/00* | (2023.01) |
| *H10N 50/01* | (2023.01) |
| *H10N 50/10* | (2023.01) |
| *H10N 50/80* | (2023.01) |
| *H10N 50/85* | (2023.01) |

(52) U.S. Cl.
CPC ............ *G11C 11/161* (2013.01); *H10B 61/00* (2023.02); *H10N 50/01* (2023.02); *H10N 50/10* (2023.02); *H10N 50/80* (2023.02); *H10N 50/85* (2023.02)

(58) Field of Classification Search
CPC ...... G11C 11/161; H10B 61/00; H10N 50/01; H10N 50/10; H10N 50/80; H10N 50/85
USPC ....................................................... 365/158
See application file for complete search history.

(56) References Cited

U.S. PATENT DOCUMENTS

| | | | | |
|---|---|---|---|---|
| 8,829,901 | B2* | 9/2014 | Pant ....................... | G01R 33/02 |
| | | | | 360/320 |
| 11,367,749 | B2* | 6/2022 | Sato ....................... | H01F 10/329 |
| 11,502,241 | B2* | 11/2022 | Song ...................... | H10B 61/10 |
| 2007/0187785 | A1* | 8/2007 | Hung ..................... | H10N 50/01 |
| | | | | 257/E43.006 |
| 2020/0161541 | A1 | 5/2020 | Tseng | |
| 2020/0161542 | A1 | 5/2020 | Ahn | |
| 2022/0392955 | A1 | 12/2022 | Lin | |

\* cited by examiner

*Primary Examiner* — Tha-O H Bui
(74) *Attorney, Agent, or Firm* — Winston Hsu

(57) ABSTRACT

A bottom-pinned spin-orbit torque magnetic random access memory (SOT-MRAM) is provided in the present invention, including a substrate, a bottom electrode layer on the substrate, a magnetic tunnel junction (MTJ) on the bottom electrode layer, a spin-orbit torque (SOT) layer on the MTJ, a capping layer on the SOT layer, and an injection layer on the capping layer, wherein the injection layer is divided into individual first part and second part, and the first part and the second part are connected respectively with two ends of the capping layer.

18 Claims, 5 Drawing Sheets

BOTTOM-PINNED SPIN-ORBIT TORQUE MAGNETIC RANDOM ACCESS MEMORY AND METHOD OF MANUFACTURING THE SAME

BACKGROUND OF THE INVENTION

1. Field of the Invention

The present invention relates generally to a spin-orbit torque magnetic random access memory (SOT-MRAM), and more specifically, to a bottom-pinned SOT-MRAM and method of manufacturing the same.

2. Description of the Prior Art

Magnetic random access memory (MRAM) is considered to be a promising and emerging memory in the future of memory industry due to its fast read/write speeds, non-volatility and integratability with semiconductor process. Start from early magnetic field operation to recent commercially produced spin-transfer torque (STT) type, and further to current spin-transfer orbit (SOT) type researched and developed actively in the industry, the operation model of MRAM evolves correspondingly from indirectly application of magnetic field through current to directly granting temporal pulses for fast read/write operation.

With regard to spin-orbit torque magnetic random access memory (SOT-MRAM), SOT-MRAM may be classified into top-pinned type or bottom-pinned type depending on the position of their pinned layers, wherein the pinned layer of bottom-pinned SOT-MRAM is, namely, under magnetic unit while the spin-orbit torque layer is over the magnetic unit and is applied with current through an injection layer to generate spin moment and achieve the effect of flipping the magnetic moment of magnetic films.

However, in the design of current bottom-pinned SOT-MRAM, the current applied from the injection layer doesn't flow completely through the spin-orbit torque layer, instead, it may be bypassed by the injection layer itself and cause only parts of the current flowing through the spin-orbit torque layer, so that it may require current more than expected to achieve the operation of memory, and the channel width of transistor has to be increased accordingly in the design, which is disadvantageous to the scaling of memory. Therefore, those of skilled in the art still need to improve current structure of bottom-pinned SOT-MRAM in order to solve the issue of inefficient current usage due to the aforementioned structural design.

SUMMARY OF THE INVENTION

In the light of the aforementioned disadvantages in current conventional skills, the present invention hereby provides a novel bottom-pinned spin-orbit torque magnetic random access memory (SOT-MRAM) and method of manufacturing the same, with features of dividing an injection layer for applying electric current into individual two parts and connecting the two parts respectively with two ends of a spin-orbit torque layer, so as to achieve the effect of making a spin current completely flowing through the spin-orbit torque layer.

One aspect of the present invention is to provide a SOT-MRAM with structures including a substrate, a bottom electrode layer on the substrate, a magnetic tunnel junction on the bottom electrode layer, a spin-orbit torque layer on the magnetic tunnel junction, a capping layer on the spin-orbit torque layer and an injection layer on the capping layer, wherein the injection layer is divided into individual first part and second part, and the first part and the second part are connected respectively with two ends of the capping layer.

Another aspect of the present invention is to provide a method of manufacturing a bottom-pinned spin-orbit torque magnetic random access memory, including steps of providing a substrate, forming a bottom electrode layer, a pinned layer, a reference layer, a free layer, a spin-orbit torque layer and a capping layer sequentially on the substrate, performing a photolithography process to pattern the bottom electrode layer, the pinned layer, the reference layer, the free layer, the spin-orbit torque layer and the capping layer into a memory unit, forming an injection layer on the capping layer, and performing another photolithography process to pattern the injection layer into individual first part and second part, wherein the first part and the second part are connected respectively with two ends of the capping layer.

Still another aspect of the present invention is to provide a method of manufacturing a bottom-pinned spin-orbit torque magnetic random access memory, including steps of providing a substrate, forming a bottom electrode layer, a pinned layer, a reference layer, a free layer, a spin-orbit torque layer, a capping layer and a metal oxide layer sequentially on the substrate, performing a photolithography process to pattern the bottom electrode layer, the pinned layer, the reference layer, the free layer, the spin-orbit torque layer, the capping layer and the metal oxide layer into a memory unit, forming an injection layer on the metal oxide layer, wherein a part of the injection layer is directly connected with the metal oxide layer, and performing an annealing process to make oxygen atoms in the metal oxide layer into the injection layer, thereby oxidizing the part of injection layer directly connected with the metal oxide layer into a blocking layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
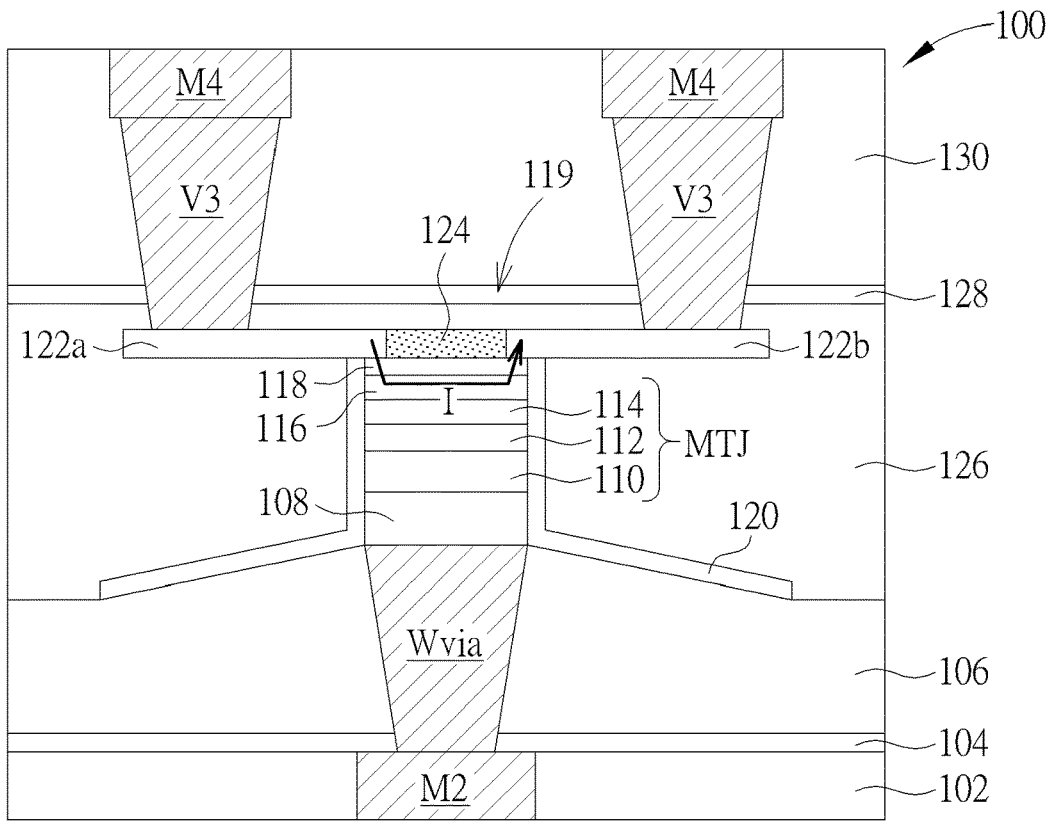
FIG. 1 is a schematic cross-section of a bottom-pinned spin-orbit torque magnetic random access memory (SOT-MRAM) in accordance with one embodiment of the present invention.

Relative dimensions and proportions of parts of the drawings have been shown exaggerated or reduced in size, for the sake of clarity and convenience in the drawings. The same

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

First, please refer to FIG. 1, which is a schematic cross-section of a bottom-pinned spin-orbit torque magnetic random access memory (SOT-MRAM) in accordance with one embodiment of the present invention. The SOT-MRAM 100 of the present invention is manufactured on a substrate. The substrate may include a wide array of semiconductor materials, such as silicon (Si), germanium (Ge), gallium arsenide (GaAs), indium phosphide (InP), etc. Alternatively, the substrate can be made of an electrically non-conductive material, such as a glass, a plastic, or a sapphire wafer. Since the key point of the present invention lies in the SOT-MRAM set in levels of CMOS BEOL process, the following cross-sections will show only these levels and the connections of relevant components therebetween. Take the structure of FIG. 1 for example, the SOT-MRAM of the present invention is set in an inter-metal dielectric layer 126 (ex. the third inter-metal dielectric layer IMD3), with an underlying previous dielectric structures including an inter-metal dielectric layer (ex. the second inter-metal dielectric layer IMD2) 102, a capping layer 104 and a bottom dielectric layer 106. The material of inter-metal dielectric layer 102 may be ultra low-k (ULK) materials, with a metal interconnection layer (ex. the second metal interconnection layer) M2 formed therein. The thin capping layer 104 is formed on the surfaces of inter-metal dielectric layer 102 and metal interconnection layer M2, with a material like silicon carbon nitride (SiCN) to function as an etch stop layer. The thick bottom dielectric layer 106 is formed on the capping layer 104, with a material like tetraethyl orthosilicate (TEOS) to serve as an initial layer for the MRAM of the present invention.

Refer still to FIG. 1. The SOT-MRAM 100 may include layer structures like a bottom electrode layer 108, a pinned layer 110, a reference layer 112, a free layer 114, a spin-orbit torque (SOT) layer 116 and a capping layer 118 from bottom to top. These layer structures are patterned into individual memory units 119, which completely overlay each other in the direction vertical to the substrate, and are electrically connected to a metal interconnection layer M2 below from the bottom electrode layer 108 through a tungsten via (Wvia) passing through the capping layer 104. The material of bottom electrode layer 108 may be tantalum (Ta), platinum (Pt), gold (Au), ruthenium (Ru) and the multilayer structure thereof. The pinned layer 110, the reference layer 112 and the free layer 114 above the bottom electrode layer 108 constitute the magnetic tunnel junction (MTJ) of the SOT-MRAM 100. In the present invention, since the pinned layer 110 is formed at bottom of the MTJ structure, it is therefore referred as a bottom-pinned SOT-MRAM.

In the embodiment of present invention, the material of pinned layer 110 may be ferromagnetic material, which includes but not limited to iron (Fe), cobalt (Co), nickel (Ni) or the alloy thereof like CoFeB or CoFe. Alternatively, the pinned layer 110 may be made of antiferromagnetic (AFM) material, which includes but not limited to FeMn, PtMn, IrMn, NiO or the combination thereof. The material of reference layer 112 may be ferromagnetic material, which includes but not limited to Co, CoFe, NiFe or NiCoFe. The function of pinned layer 110 and reference layer 112 is to fix or limit the directions of magnetic moment of adjacent layer structures, so that they will not be flipped by external magnetic field, wherein the magnetic moment of reference layer 112 may be the reference of the magnetization direction of the free layer 114 above, while the pinned layer 110 may be used to compensate the stray magnetic field of the reference layer 112, with a magnetic moment opposite to the one of the reference layer 112. The pinned layer 110 and the reference layer 112 may be collectively referred as a synthetic antiferromagnet (SAF) layer. The material of free layer 114 may be ferromagnetic material, which includes but not limited to Fe, Co, Ni or the alloy thereof like CoFeB or CoFe. The magnetic moment of the free layer 114 may be freely flipped and altered through external electric field. When the magnetization directions of reference layer 112 and free layer 114 are the same, the spin directions of a majority of electrons in the two ferromagnetic materials are the same, so that they will have higher tunneling probability, thereby having larger tunneling current and the MTJ will be rendered in low-resistance state ("0"bit). Conversely, the MTJ will be rendered in high-resistance state ("1"bit). This is principle how to achieve data storage by MRAM through the approach of altering the spin direction of electrons to change the electrical resistance. In the embodiment of present invention, a tunneling barrier (not shown) may be formed between the pinned layer 110, the reference layer 112 and the free layer 114, with an insulating material including but not limited to magnesium oxide (MgO) or aluminum oxide ($AlO_x$). Spacers 120 are further formed on outer sides of the memory unit, which extends along the sidewalls of capping layer 118, spin-orbit torque layer 116, free layer 114, reference layer 112, pinned layer 110, bottom electrode layer 108 to the surface of parts of underlying bottom dielectric layer 106. Spacer 120 may provide protection effect for the memory units 119, with a material of silicon nitride ($SiN_x$).

Figure 7:
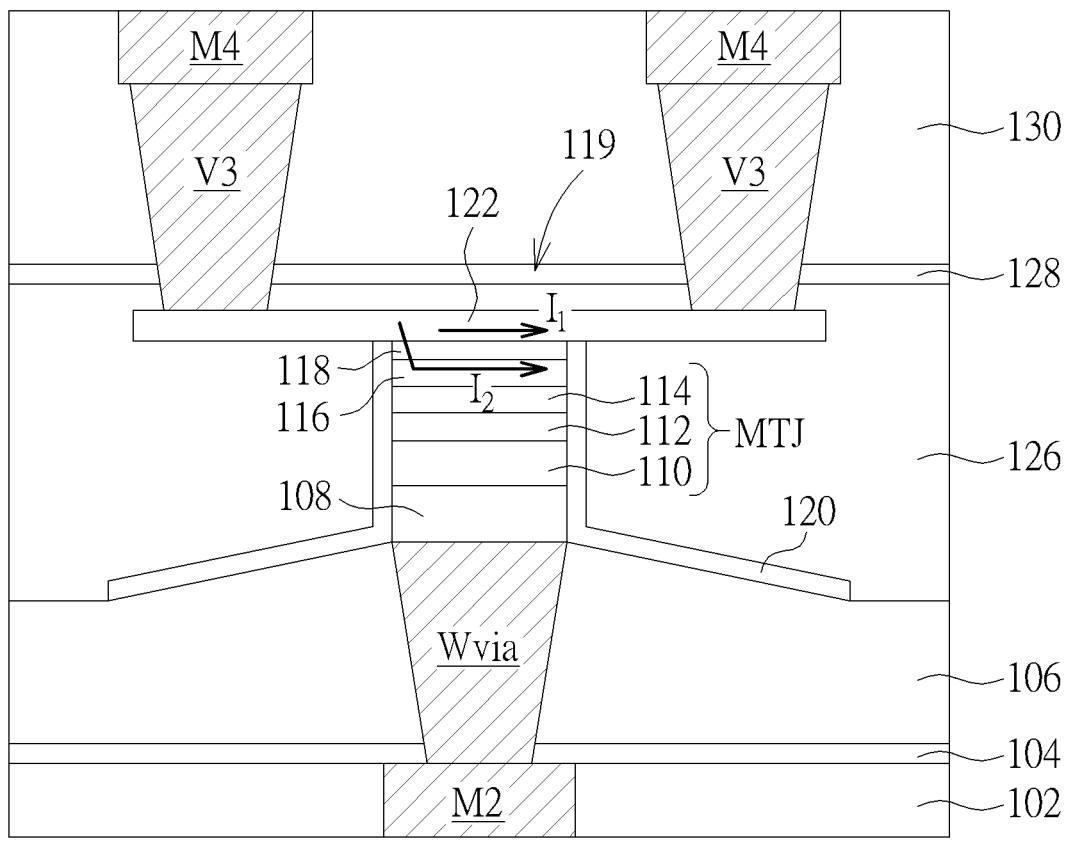

Please refer now to FIG. 7. In conventional bottom-pinned SOT-MRAM structure, an injection layer 122 is designedly set on the memory unit 119 to provide current flowing through spin-orbit torque layer 116, so that spin moment may be generated by spin Hall effect (SHE) to alter the magnetic moment of magnetic materials in the MTJ. The whole memory unit 119 including the injection layer 122 is formed within the inter-metal dielectric layer 126. Two ends of the injection layer 122 are connected respectively through vias V3 to the metal interconnection layer M4 formed in the overlying inter-metal dielectric layer (ex. the fourth inter-metal dielectric layer IMD4). In conventional skill, the current flowing from one end of the injection layer 122 is bypassed at the interface between injection layer 122 and capping layer 118, wherein a portion of the current $I_1$ will flow continuously through the path of injection layer 122 to the other end, while the other portion of the current $I_2$ will flow through the path of spin-orbit torque layer 116 to the other end of the injection layer 122. This bypassing phenomenon would result in only a portion (ex. 169 µA) of the original input current (ex. 310 µA) flowing through the spin-orbit torque layer 116 to have the effect of altering the magnetic moment. This phenomenon further leads to the requirement of applying a current more than expected from the injection layer 122 in order to achieve normal operation of the MRAM, and the channel width of transistor has to be increased accordingly in the design, which is disadvantageous to the scaling of memory.

Regarding this, please refer back to FIG. 1. In the embodiment of present invention, a blocking layer 124 is designedly formed at the middle section where the injection layer and the capping layer 118 contact each other. The blocking layer 124 divides the whole injection layer into individual first part 122a and second part 122b, which are connected respectively with two ends of the capping layer 118 below. The material of blocking layer 124 may be the oxide of the material of the injection layer. For example, the material of the injection layer may be titanium nitride (TiN), titanium (Ti), tantalum nitride (TaN) or tantalum (Ta), and the material of the blocking layer 124 may be titanium oxide ($TiO_x$) or tantalum oxide ($TaO_x$). Since the electrical resistance of the oxide-based blocking layer 124 is far higher than the one of the spin-orbit torque layer 116, most of the current I flowing from the first part 122a of the injection layer will flow through the path of spin-orbit torque layer 116 below to the second part 122b of the injection layer, thereby solving the issue of current bypassing by the injection layer. This structural design may achieve better and efficient current usage in the SOT-MRAM of present invention. Take the aforementioned conventional skill for example, if a current of 169 µA is required to flow through the spin-orbit torque layer 116 in order to achieve necessary spin-orbit torque, then it need to apply only a current slightly larger than 169 µA from the injection layer, rather than a current of 310 µA (nearly twice the 169 µA) like the one in conventional skill due to the bypassing phenomenon. The width of transistor required in the present invention may be, therefore, reduced to half of the one in conventional skill, and so does the area of the SOT-MRAM unit in the present invention, which is advantageous to the scaling of memory device. Please note that the width of the blocking layer 124 in horizontal direction shown in the embodiment of FIG. 1 is slightly smaller than the one of the memory unit 119 below. However, in other embodiment like the one shown in FIG. 9, the width of the blocking layer 124 in horizontal direction may be the same as the one of the memory unit 119 below.

Figure 2:
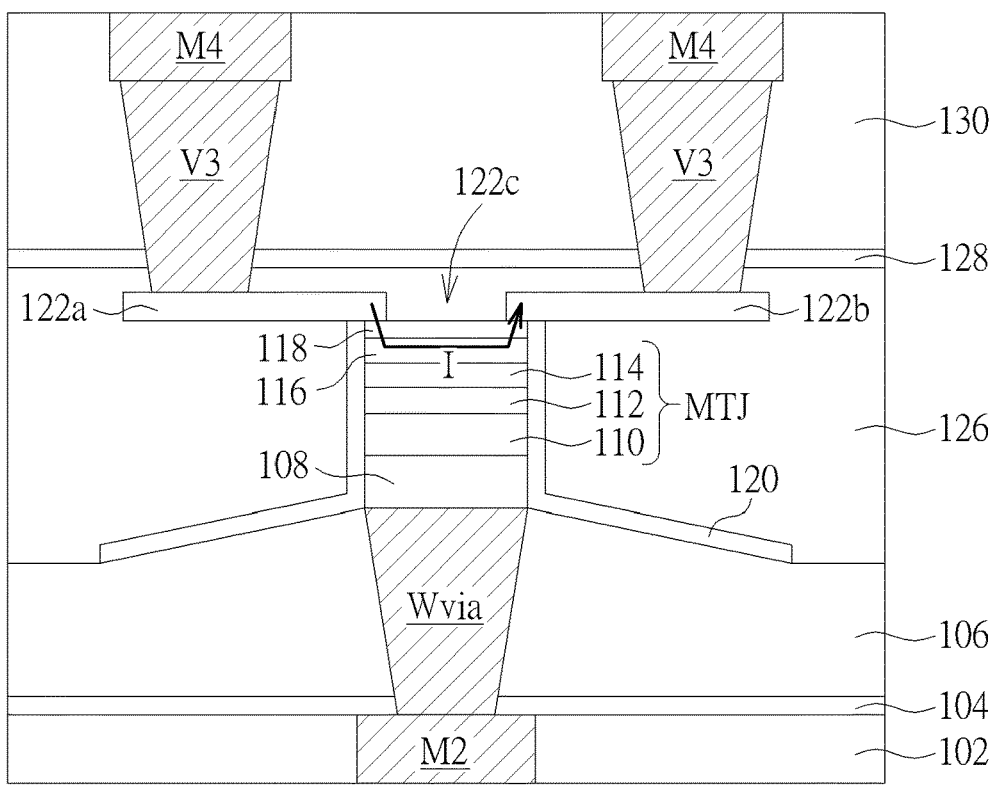
FIG. 2 is a schematic cross-section of a bottom-pinned SOT-MRAM in accordance with another embodiment of the present invention.

Please refer now to FIG. 2, which is a schematic cross-section of a bottom-pinned SOT-MRAM in accordance with another embodiment of the present invention. The difference between this embodiment and the aforementioned embodiment of FIG. 1 is that the injection layer in this embodiment is not formed with a blocking layer. Instead, the middle section 122c of the injection layer is directly removed to divide the injection layer into individual first part 122a and second part 122b. The advantage of this embodiment is that all of the current applying from the injection layer is ensured to flow through the spin-orbit torque layer 116, which may further improve the current efficiency of the MRAM in present invention.

Please refer now to FIGS. 3-9, which are schematic cross-sections illustrating a process flow of manufacturing a SOT-MRAM. First, a substrate is provided in FIG. 3 to serve as a base for whole MRAM. The substrate may include structures like the aforementioned inter-metal dielectric layer (ex. the second inter-metal dielectric IMD2) 102, capping layer 104 and bottom electrode layer 106, with materials respectively like ultra low-k (ULK) material, silicon carbon nitride (SiCN) and tetraethyl orthosilicate (TEOS), and may be formed through deposition methods like plasma enhanced chemical vapor deposition (PECVD), atmospheric pressure chemical vapor deposition (APCVD) or low pressure chemical vapor deposition (LPCVD), wherein the metal interconnection layer M2 is already formed in the inter-metal dielectric layer 102, and tungsten via Wvia is already formed in the bottom dielectric layer 106 to connect with the metal interconnection layer M2 below through the capping layer 104.

Figure 3:
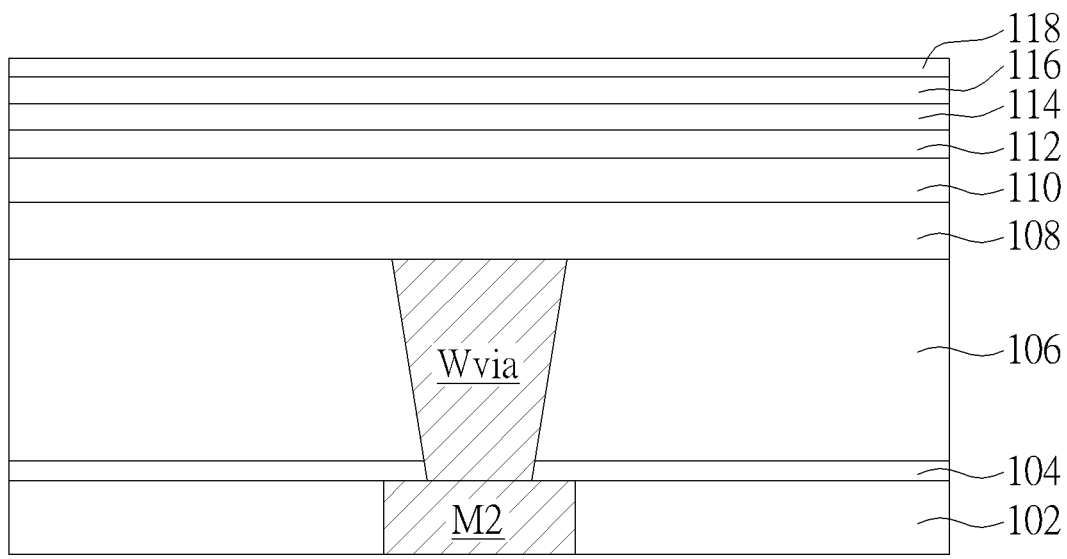
FIGS. 3-9 are schematic cross-sections illustrating a process flow of manufacturing a SOT-MRAM.

Refer still to FIG. 3. Layer structure of memory unit like bottom electrode layer 108, pinned layer 110, reference layer 112, free layer 114, spin-orbit torque layer 116 and capping layer 118 are formed sequentially on the bottom dielectric layer 106 and tungsten via Wvia, wherein the material of bottom electrode layer 108 may be tantalum (Ta), platinum (Pt), gold (Au), ruthenium (Ru) and the multilayer structure thereof. The material of pinned layer 110 may include but not limited to iron (Fe), cobalt (Co), nickel (Ni) or the alloy thereof like CoFeB or CoFe. The material of reference layer 112 may include but not limited to Co, CoFe, NiFe or NiCoFe. The material of free layer 114 may include but not limited to iron (Fe), cobalt (Co), nickel (Ni) or the alloy thereof like CoFeB or CoFe. The material of spin-orbit torque layer 116 may include tungsten (W). The material of capping layer 118 may include ruthenium (Ru). The aforementioned layer structures may all be formed through physical vapor deposition (PVD) or sputter process.

Figure 4:
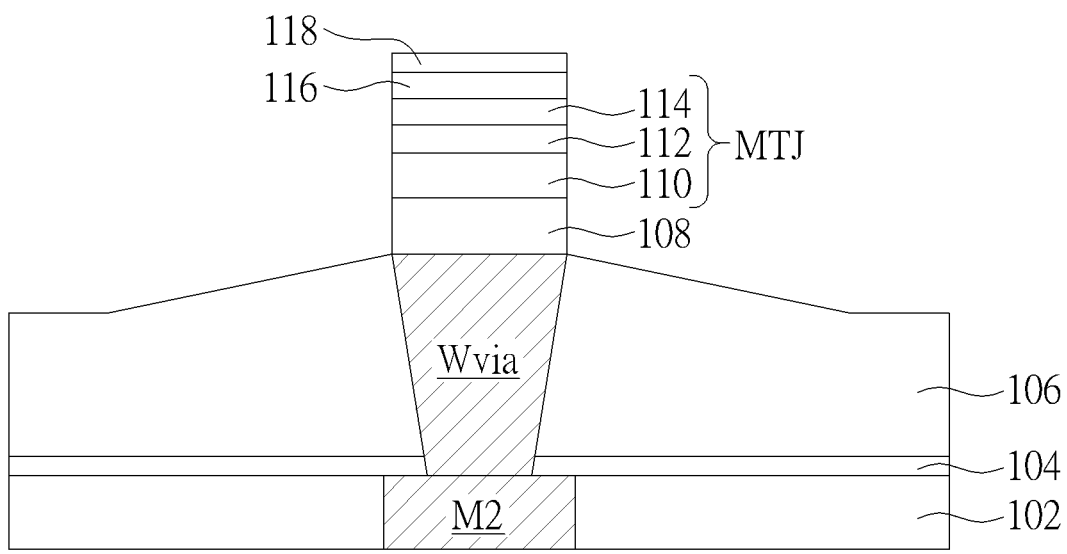

Please refer to FIG. 4. After the aforementioned layer structures are formed, an ion beam etching process is performed to pattern these layer structures into individual memory units 119, wherein the pinned layer 110, the reference layer 112 and the free layer 114 serve collectively as the magnetic tunnel junction (MTJ) of the MRAM, with its top and bottom connected respectively with the spin-orbit torque layer 116 and the bottom electrode layer 108. Ru-based capping layer 118 may function as a hard mask layer in this etching process to protect the spin-orbit torque layer 116 and the MTJ structure below from damage. As shown in FIG. 4, the bottom dielectric layer 106 is provided with a cross-sectional profile slightly elevated toward the memory unit 119 after etching.

Figure 5:
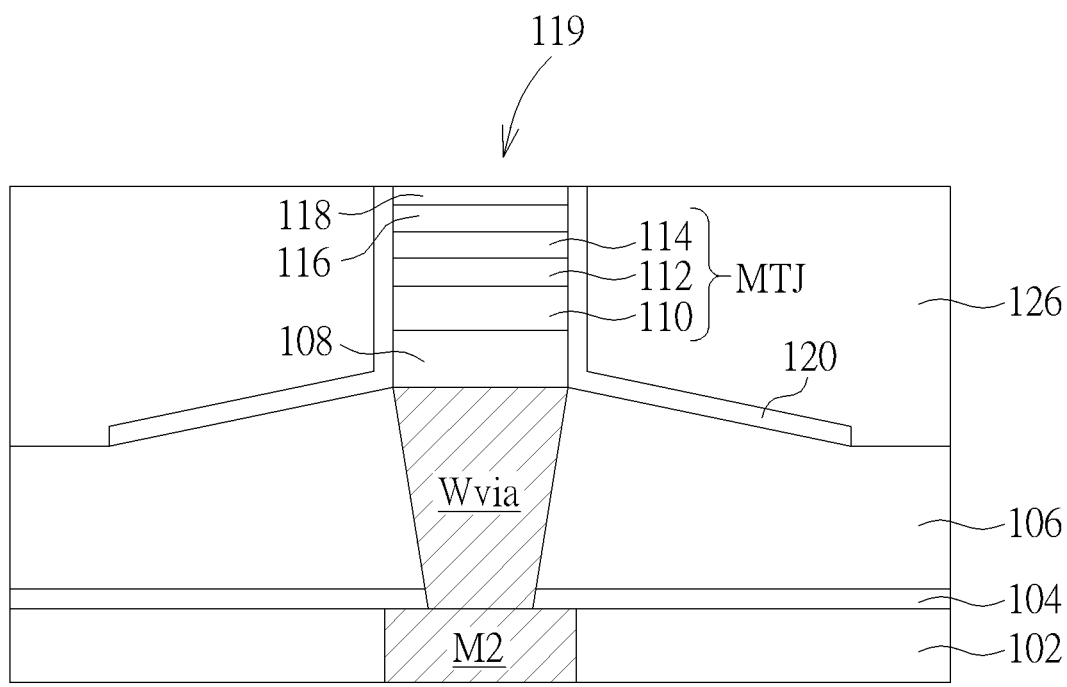

Please refer to FIG. 5. After patterned magnetic memory units 119 are formed, protective spacers 120 are then formed on sidewalls of the magnetic memory units 119. The material of spacer 120 may be silicon nitride, which may be formed by steps of first forming a conformal spacer layer on surfaces of the memory units 119 and bottom dielectric layer 106 and then performing a photolithography process to pattern the spacer layer. The spacer 120 extends along the sidewalls of capping layer 118, spin-orbit torque layer 116, free layer 114, reference layer 112, pinned layer 110 and bottom electrode layer 108 onto the surface of parts of the bottom dielectric layer 106 below. After the spacers 120 are formed, an inter-metal dielectric layer (ex. the third inter-metal dielectric layer IMD3) 126 is formed on the bottom dielectric layer 106 surrounding the memory unit 119. The material of inter-metal dielectric layer 126 may be ultra low-k (ULK) material, which may be formed through PECVD process and may be treated by a planarization process to flush its top surface with the top surface of the capping layer 118 of the memory unit 119.

Figure 6:
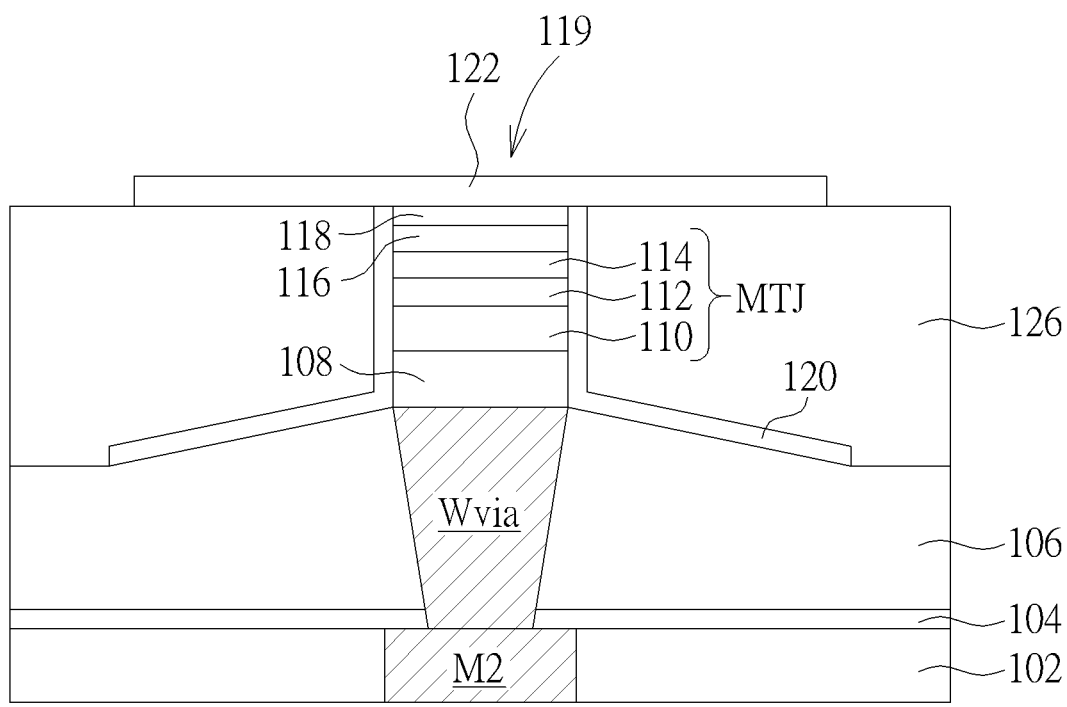

Please refer to FIG. 6. After the spacers 120 and the inter-metal dielectric layer 126 are formed, an injection layer 122 is then formed on the top surfaces of the inter-metal dielectric layer 126 and the memory unit 119. In the embodiment of present invention, the material of injection layer 122 may be titanium nitride (TiN), titanium (Ti), tantalum nitride (TaN) or tantalum (Ta), which may be formed by steps of first forming a material layer on the surface through a sputtering process and then patterning the material layer through a reactive ion etching process. In the embodiment of present invention, the middle section of patterned injection layer 122 contacts the capping layer 118 of the memory unit 119.

Please refer to FIG. 7. After the injection layer 122 is formed, another dielectric layer is covered on the injection layer 122 to encapsulate the whole memory unit 110 including the injection layer 122 within the inter-metal dielectric layer 126. Thereafter, a capping layer 128 (with a material like SiCN) and an inter-metal dielectric layer (ex. the fourth inter-metal dielectric layer IMD4, with a material like ULK) 130 are formed sequentially on the inter-metal dielectric layer 126, and interconnection structures like metal interconnection layer M4 and vias V3 are also formed in the inter-metal dielectric layer 130. Two ends of the injection layer 122 are connected respectively to the metal interconnection layer M4 above through vias V3. It can be seen from the figure that, in this stage, the injection layer 122 is still connected entirely on the capping layer 118 of memory unit 110 like the one in conventional skill. Regarding this, the following embodiments will describe how to divide the injection layer 122 into two individual parts in the present invention.

Figure 8:
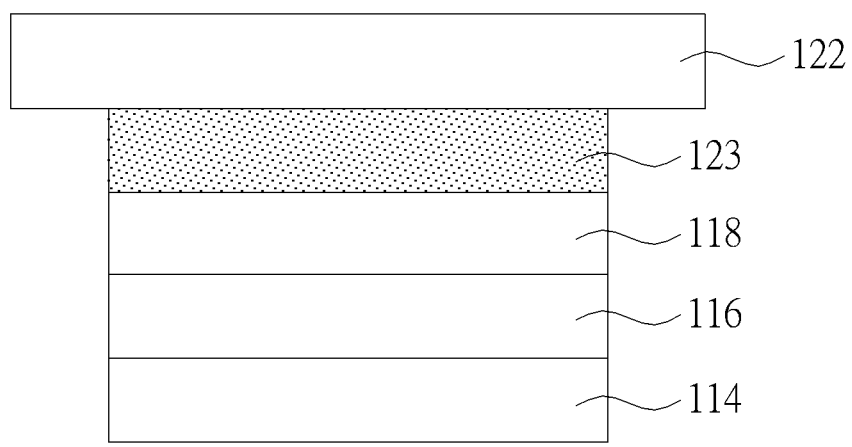

Please refer to FIG. 8. In one of the embodiments, a metal oxide layer 123 is further formed between the injection layer 122 and the capping layer 118 of memory unit 119 in the present invention. The metal oxide layer 123 in this embodiment function as a scavenging layer to provide oxygen atoms for the overlying injection layer 122 in order to form an oxide-based blocking layer. In this embodiment, the material of metal oxide layer 123 is designedly corresponded to the material of injection layer 122. For example, when the material of injection layer 122 is titanium (Ti) or titanium nitride (TiN), the material of the metal oxide layer 123 maybe titanium oxide ($TiO_x$). Alternatively, when the material of injection layer 122 is tantalum (Ta) or tantalum nitride (TaN), the material of the metal oxide layer 123 may be titanium oxide ($TaO_x$). The design of corresponding materials may help to diffuse the oxygen atoms from the metal oxide layer 123 into the injection layer 122.

Figure 9:
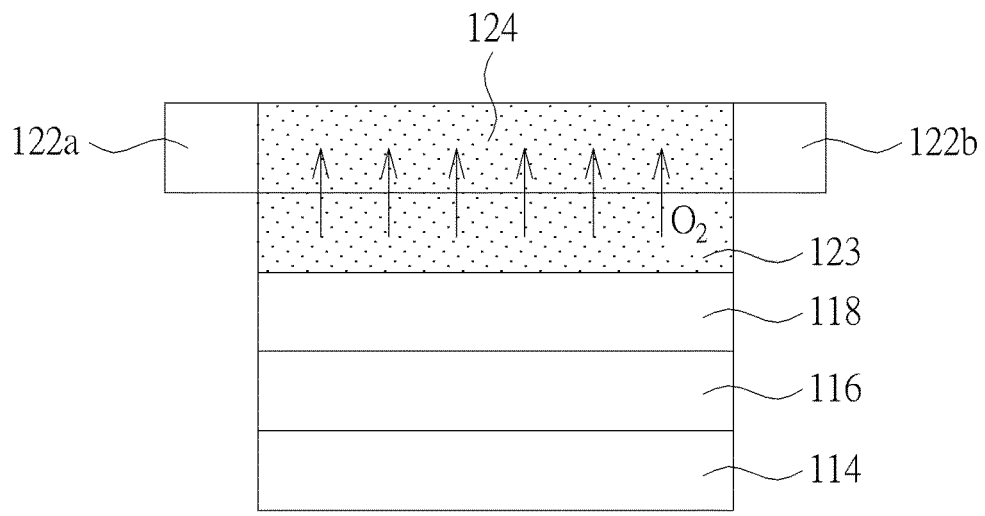

Please refer to FIG. 9. Following the step of forming the injection layer 122 in FIG. 6, an annealing process is performed to diffuse the oxygen atoms in the metal oxide layer 123 into adjacent injection layer 122. In this way, as shown in FIG. 9, the part of injection layer 122 abutting on the metal oxide layer 123 is transformed into a blocking layer 124, with a material like titanium oxide or tantalum oxide. The blocking layer 124 formed in this step would divide the injection layer 122 into individual first part 122a and second part 122b, and since the material of blocking layer 124 formed in this step is the same as the one of underlying metal oxide layer 123, their electrical resistances would be very close too. In another aspect, since the material of metal oxide layer 123 is corresponded to the one of the injection layer 122 in this step, it is easier for oxygen atoms to diffuse into the injection layer 122. In the present invention, the capping layer 118 also abuts under the metal oxide layer 118. However, since its material (ex. Ru) is not designedly corresponded to the one of metal oxide layer 123, no oxide part will be formed in the capping layer 118 in this step. In this embodiment, since the electrical resistance (about 1040Ω) of the oxide-based blocking layer 124 is almost the same as the one of the metal oxide layer 123 and is far higher than the one (about 347Ω) of the spin-orbit torque layer 116 below, most of the current applying from the first part 122a of injection layer would flow through the path of spin-orbit torque layer 116 to the second part 122b of injection layer, which may prevent the issue of current being bypassed by the injection layer.

Figure 10:
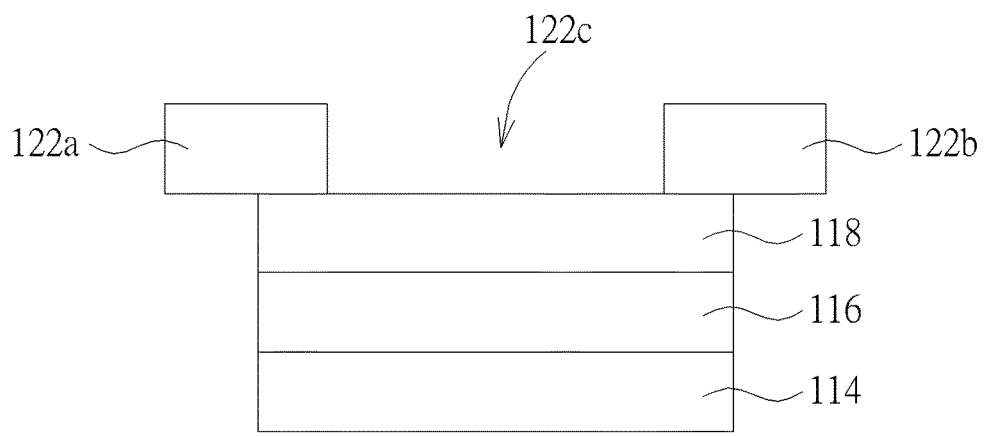
FIGS. 10-11 are schematic cross-sections illustrating a process flow of manufacturing a SOT-MRAM.

Please refer to FIG. 10. In another embodiment, following the step of forming the injection layer 122 in FIG. 6, the injection layer 122 is directly patterned into individual first part 122a and second part 122b through a photolithography process in the present invention. As shown in FIG. 10, the middle section 122c of the injection layer is removed in this process so that the injection layer is divided into individual first part 122a and second part 122b, and furthermore, the first part 122a and the second part 122b are connected respectively with two ends of the capping layer 118 below. In this way, the current applied from the first part 122a of the injection layer will all flow through the spin-orbit torque layer 116 below to the second part 122b of the injection layer, which may significantly improve current efficiency.

Figure 11:
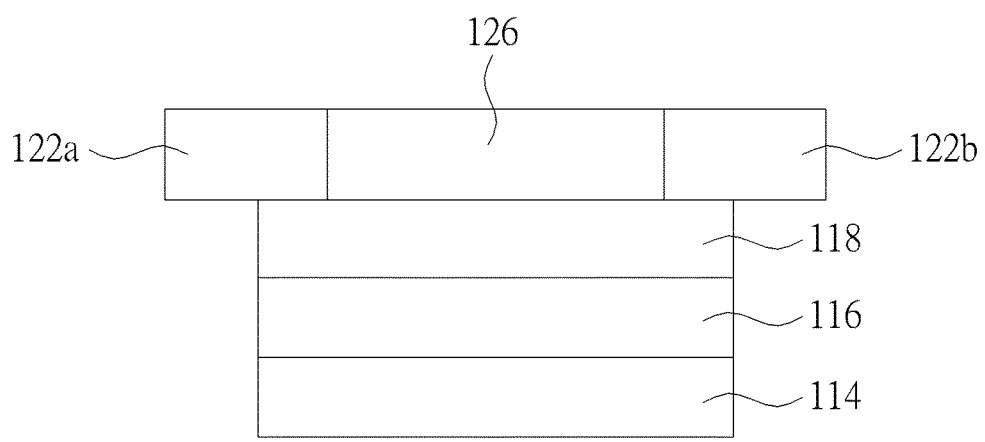

Please refer to FIG. 11. After the injection layer is divided into the first part 122a and the second part 122b, the position of previous middle section 122c of the injection layer may be filled with an insulating layer 126 to further improve the electrical insulation between the first part 122a and the second part 122b. The insulating layer 126 may be apart of the inter-metal dielectric layer 126 that will be covered on the injection layer 122 in later process, or alternatively, it may be an additional dielectric layer with a material like ultra low-k (ULK) material, but not limited thereto.

In summary to the aforementioned embodiments, the present invention divides the injection layer of a bottom-pinned SOT-MRAM into two individual parts, so as to achieve the effect of all of the applied current flowing through the path of spin-orbit torque layer, thereby significantly improving the current efficiency of the MRAM, and in the same time beneficial to the miniaturization of transistors, which is an invention provided both with novelty and non-obviousness.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bottom-pinned spin-orbit torque magnetic random access memory, comprising:
   a substrate;
   a bottom electrode layer on said substrate;
   a magnetic tunnel junction on said bottom electrode layer;
   a spin-orbit torque layer on said magnetic tunnel junction;
   a capping layer on said spin-orbit torque layer, wherein said capping layer, said spin-orbit torque layer, said magnetic tunnel junction and said bottom electrode layer constitute a memory unit;
   an injection layer on said capping layer, wherein said injection layer is divided into a first part and a second part, and said first part and said second part are connected respectively with two ends of said capping layer; and
   an insulating layer between said first part and said second part of said injection layer, wherein a top surface of said insulating layer is flush with top surfaces of said first part and said second part of said injection layer.

2. The bottom-pinned spin-orbit torque magnetic random access memory of claim 1, wherein said magnetic tunnel junction comprises a pinned layer, a reference layer and a free layer from bottom to top.

3. The bottom-pinned spin-orbit torque magnetic random access memory of claim 1, wherein said bottom electrode layer is connected to an underlying metal interconnection layer through a via.

4. The bottom-pinned spin-orbit torque magnetic random access memory of claim 1, wherein said first part and said second part are connected respectively to an overlying metal interconnection layer through vias.

5. The bottom-pinned spin-orbit torque magnetic random access memory of claim 1, further comprising spacers formed on sidewalls of said memory unit.

6. The bottom-pinned spin-orbit torque magnetic random access memory of claim 1, wherein said bottom electrode layer, said magnetic tunnel junction, said spin-orbit torque layer and said capping layer completely overlap in a direction vertical to said substrate.

7. The bottom-pinned spin-orbit torque magnetic random access memory of claim 1, wherein a material of said spin-orbit torque layer is tungsten.

8. The bottom-pinned spin-orbit torque magnetic random access memory of claim 1, wherein a material of said capping layer is ruthenium.

9. The bottom-pinned spin-orbit torque magnetic random access memory of claim 1, wherein a material of said injection layer is titanium nitride, titanium, tantalum nitride or tantalum.

10. A method of manufacturing a bottom-pinned spin-orbit torque magnetic random access memory, comprising:
    providing a substrate;
    forming a bottom electrode layer, a pinned layer, a reference layer, a free layer, a spin-orbit torque layer and a capping layer sequentially on said substrate;
    performing a photolithography process to pattern said bottom electrode layer, said pinned layer, said reference layer, said free layer, said spin-orbit torque layer and said capping layer into a memory unit;
    forming an injection layer on said capping layer;
    performing another photolithography process to pattern said injection layer into individual first part and second part, wherein said first part and said second part are connected respectively with two ends of said capping layer; and
    forming an insulating layer between said first part and said second part, wherein a top surface of said insulating layer is flush with top surfaces of said first part and said second part of said injection layer.

11. The method of manufacturing a bottom-pinned spin-orbit torque magnetic random access memory of claim 10, further comprising forming spacers on sidewalls of said memory unit.

12. The method of manufacturing a bottom-pinned spin-orbit torque magnetic random access memory of claim 10, wherein a material of said spin-orbit torque layer is tungsten.

13. The method of manufacturing a bottom-pinned spin-orbit torque magnetic random access memory of claim 10, wherein a material of said capping layer is ruthenium.

14. The method of manufacturing a bottom-pinned spin-orbit torque magnetic random access memory of claim 10, wherein a material of said injection layer is titanium nitride, titanium, tantalum nitride or tantalum.

15. A method of manufacturing a bottom-pinned spin-orbit torque magnetic random access memory, comprising:
    providing a substrate;
    forming a bottom electrode layer, a pinned layer, a reference layer, a free layer, a spin-orbit torque layer, a capping layer and a metal oxide layer sequentially on said substrate;

performing a photolithography process to pattern said bottom electrode layer, said pinned layer, said reference layer, said free layer, said spin-orbit torque layer, said capping layer and said metal oxide layer into a memory unit;

forming an injection layer on said metal oxide layer, wherein a part of said injection layer is directly connected with said metal oxide layer; and performing an annealing process to make oxygen atoms in said metal oxide layer into said injection layer, thereby oxidizing said part of said injection layer directly connected with said metal oxide layer into a blocking layer.

16. The method of manufacturing a bottom-pinned spin-orbit torque magnetic random access memory of claim 15, wherein a material of said injection layer is titanium nitride, titanium, tantalum nitride or tantalum.

17. The method of manufacturing a bottom-pinned spin-orbit torque magnetic random access memory of claim 15, wherein a material of said metal oxide layer is titanium oxide or tantalum oxide.

18. The method of manufacturing a bottom-pinned spin-orbit torque magnetic random access memory of claim 15, wherein a material of said blocking layer is titanium oxide or tantalum oxide.

* * * * *